United States Patent [19]

Fitzky et al.

[11] 4,385,102
[45] May 24, 1983

[54] LARGE-AREA PHOTOVOLTAIC CELL

[75] Inventors: Hans G. Fitzky, Odenthal; Harold Ebneth, Leverkusen, both of Fed. Rep. of Germany

[73] Assignee: Bayer Aktiengesellschaft, Leverkusen, Fed. Rep. of Germany

[21] Appl. No.: 249,252

[22] Filed: Mar. 30, 1981

[30] Foreign Application Priority Data

Apr. 11, 1980 [DE]  Fed. Rep. of Germany ....... 3013991

[51] Int. Cl.³ ...................... H01L 31/06; H01M 6/36
[52] U.S. Cl. .................................. 429/111; 136/256; 136/257; 136/260; 357/30
[58] Field of Search ................. 136/256, 257, 258 PC, 136/260, 245; 429/111; 357/30 J, 30 K, 65, 68, 71

[56] References Cited

U.S. PATENT DOCUMENTS 4,169,739  10/1979  Lindmayer .................... 148/1.5

Primary Examiner—Aaron Weisstuch
Attorney, Agent, or Firm—Sprung, Horn, Kramer & Woods

[57] ABSTRACT

In a large-area photovoltaic cell containing a photoactive semiconductor layer which contacts another semiconductor layer, metal or an electrolyte to form a depletion layer, and further containing an electrode and a counter electrode for current collection, the improvement which comprises employing as a substrate for said photoactive semiconducting layer a metallized textile sheet, the metal constituting one of the electrodes, the sheet having been metallized by depositing the metal thereon wet-chemically without current. The metal thickness may be built up with or without current. Such cells have low internal resistances and are highly efficient.

11 Claims, 4 Drawing Figures

LARGE-AREA PHOTOVOLTAIC CELL

This invention relates to a large-area photovoltaic cell, containing semiconductor layers which in contact with another semiconductor, metal or an electrolyte, have developed a depletion layer, and further containing an electrode and a counter electrode for current collection.

Cells of this type are mainly used for converting solar energy into electrical energy and they are also known as solar cells. Two types of solar cells may be distinguished: the "dry" cell and "wet" cell. In the former case, the depletion layer is developed in the solid (monocrystalline or polycrystalline) photosemiconductor (often Si or GaAs) by doping or by a specific semiconductor construction on a metal. The transition to the connecting ohmic contacts must then be barrier free. In the case of a "wet" cell which may also be designed as a photoelectrochemical cell, the barrier layer is formed at the transition of the semiconductor to the electrolyte. Cells in which the semiconductor material may be polycrystalline are cheaper, but the high cost of material for all solar cells known hitherto is another serious restriction. There are also considerable problems when increasing the efficiency, when enlarging the irradiated surface, in the contacting process and in the derivation of current and the resistance to atmospheric conditions.

A survey or the prior art is provided, for example, in "Topics in Applied Physics" (Edited by B. O. Seraphim), Vol. 31, Springer, Berlin, 1979. This publication described, for example. a $Cu_2S$-CdS-front-wall cell in the article by M. Savelli and J. Bougnot on pages 213 to 256. A 30 $\mu$m thick CdS-layer and a 0.2 $\mu$m $Cu_2S$-layer are on a film. Contact takes place on the side facing the light through an imprinted grid made of gold or copper. The conductor cross sections are unsuitable for conducting greater currents. A "wet" solar cell is described in the above-mentioned publication by H. Gerischer on page 115 to 172. A conductive glass is used for front contact which is unsuitable for low-loss current transmission in the case of a large-area design due to too low a conductivity. Current loads which are usual today are as high as 25 mA/cm$^2$ with cell voltages of from 0.4 to 0.8 volts depending on the type of semiconductor.

In order to achieve a greater weight-specific efficiency, the thin-film cell technique is used; such cells based on a film are partly flexible. The absorption layer for sunlight which contains the semiconductor depletion layer (barrier layer) and in which the photoelectric voltage develops amounts to from 1 to 5 $\mu$m. This layer thickness is not typical merely because of the film technique. It should be thin enough so that the efficiency does not decrease; for an effective separation of the photo-induced charge carriers and transmission to the electrodes, the thickness of the whole semiconductor layer should be not much greater than that of the depletion layer.

In order to utilize the sunlight effectively the semiconductor should have a band spacing of from 1.0 to 1.7 eV; $Cu_2S$, CdS, CdTe, $Cu_2Te$ and $CuInSe_2$ are known materials in this range. Complete light absorption in the semiconductor layer is not achieved in the known film type cells. Reflection losses occur at the semiconductor surface. Moreover, polarization and recombination losses may not be completely avoided. In the case of a solar cell with a side length of 1 m, the voltage losses must also be below 10 mV, which, hitherto, has not been achieved. An object of this invention is the development of efficient, light, large-area photovoltaic cells, in which the disadvantages known from the prior art are sufficiently overcome.

It has now been found that it is possible to deviate from the planar, layer-wise construction of the known thin-film cells if films are not used as the substrate and electrodes, but instead, metallized textile sheet structures are employed. It is precisely the "unevenness", the three-dimensional structure of the textile sheet structure that has proved to be a particular advantage, because as a result of this, the optical losses are reduced and the efficiency increases. This object of the invention is realized by providing photovoltaic cells which are characterized in that the substrate for the photoactive semiconducting layer which is simultaneously an electrode for the semiconducting layer, is a metallized textile sheet structure, wherein at least one first metal layer is deposited wet-chemically and without current ("electrolessly") on the textile sheet structure and this layer is sufficiently reinforced without current, wet-chemically or electrochemically. It is preferable that the counter electrode also be a metallized textile sheet structure, in which at least one first metal layer has also been applied wet chemically by currentless deposition. It is particularly important that the metal layer initially deposited on the textile sheet structure has a thickness of from 0.05 to 2.5 $\mu$m, whereby as a result of the method by which this metal is applied on to the textile sheet structure, it is ensured that in practical terms, an "all around encasing" is effected. It may be easily observed under a microscope how a textile sheet structure is metallised. Shadows, as produced, for example, from evaporation, are not observed. Moreover, the high electrical conductivity is a reliable indicator that the metal layer has been applied by wet-chemical currentless deposition. It is particularly favorable when the surface of the metallized textile sheet structure is considerably larger than that of a comparable film. It is particularly advantageous in terms of ease of method, if the photoactive semiconductor of the solar cell is chemically produced on the textile sheet structure from the metal layer which has been applied by wet chemical currentless deposition. It is particularly advantageous that the metallized textile sheet structure has a structure which acts as an "optical wave aborbent" for the incident active radiation; for example, this requirement is realized by a velvety or open-cell foam structure of the textile sheet structure. It may be appropriate to also provide a conductive or photoconductive lining or separating film between the semiconductive and counter electrode. In a specific embodiment, the electrode and counter electrode may be combined in a single textile sheet structure, e.g. as the warp and woof. In a particular embodiment, sensitizers or fluorescent dyes are added to the resin used for the lining. In another advantageous embodiment, a transparent protective layer is present around the solar cell.

The term "textile sheet structure" is broad and intended to include the following: woven cloth, worked cloth, knitted cloth, webs made of synthetic organic polymers, natural fibers or inorganic fibers, but also embossed films or closed or open-pore foams or papers are suitable. It is particularly important that at least the first metal layer be applied by wet chemical currentless deposition, onto these sheet structures. The type of metallizing which is important according to the invention is known per se; it is described, among other things, for different textile materials in German Offenlegungsschriften Nos. 2,739,179; 2,743,768; 2,749,151; 2,804,031; 2,820,502 and 2,820,525.

During the wet-chemical metallization process without current, a regular coating is achieved. The metallized sheet structures are still flexible after coating; the specific electrical conductivity is greater by an order of magnitude than in the case of evaporated sheet structures which contain the same quantity of metal.

By using the metallized textile sheet structures, it is possible to obtain cell sizes which have side lengths of 1 m and more, with cell currents of the order of 100 A with current losses of less than 10 mV.

Photovoltaic cells having metallized textile sheet structures have another novel type of feature compared to cells made from films, i.e., the optical efficiency is greater. The reflection losses at the absorption layer decrease due to the spatial depth staggering of the textile structure, the yield is increased by the multiple reflections, and the structure of the textile sheet structure acts as an optical wave absorbent for the incoming active light.

The low resistance output of the photocurrent is also very advantageous for very large-area solar cells, and so is the reduced susceptibility to trouble due to the flexibility of the electrodes. Metallic bridge formation between the fibers is not observed. The non-cohesive structure with the large surface is a great advantage. The specific metal surface area is very high (depending on the textile construction, by as much as or more than a factor of 100). The total efficiency may be increased up to a factor of 2. Effective adhesion to the base is achieved by the wet-chemical, currentless deposition of the metal layer, no disturbing abrasion being observed. The textile sheet structure is covered with sufficient metal to provide a resistance of from 0.001 to 0.01 ohm (measured according to DIN 54 345). This means that the metal layer thickness which is applied should be from 0.5 to 25 $\mu$m. It has been shown that not all the metal has to be deposited wet-chemically without current, but that it is sufficient that at least one layer of from 0.05 to 2.5 $\mu$m is initially deposited wet-chemically without current; the reinforcement of the layer to the required thickness may then also be effected, for example, electrochemically.

The photoactive semiconductor layer may be applied by deposition from the vapor, gas or liquid phase. However, it is particularly advantageous in terms of method to form it from the metal layer on the textile sheet structure. Various processes are known for this purpose. For example, for the production of an n-conducting cadmium sulphide layer, a cadmium layer may be initially applied electrochemically on to the metallized textile sheet structure, and is then converted into a cadmium sulphide layer of the required thickness and composition using known chemical measures. It is also known, for example, to produce a p-conducting $Cu_2S$-layer on a copper layer which has been produced chemically or electrochemically, on to which p-conducting $Cu_2S$-layer an n-conducting CdS-layer is then applied. It may be shown by scanning electron microscope recordings that the surface is very considerably enlarged, depending on the textile construction. The efficiency of the solar cell is increased by the more effective radiation absorption where there is multiple reflection and by the reduction in the transition resistance between the substrate and photo semiconductor. It may be necessary in order to improve the contact with the counter electrode to apply a conductive or photoconductive lining or separating film to the counter electrode. It may be appropriate to admix sensitizers and/or fluorescent dyes to the resin. Circumstances permitting, the efficiency may be further increased as a result thereof. Return currents from short circuits may also be substantially prevented by the lining.

Figure 1:
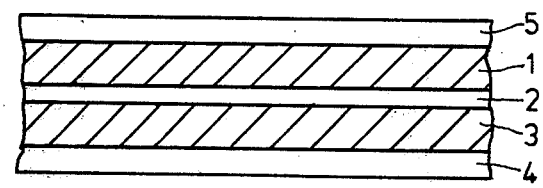
FIG. 1 is a schematic section through a "dry" solar cell.

A solar cell with a p-n-semiconductor barrier layer will mainly be discussed hereinbelow. It is known to those skilled in the art that metal semiconductor or MIS layers may also be utilized in solar cells. The solar cell according to FIG. 1 is based on a polyester-cotton-textile fiber cloth in L 1/1 weave; 50% of the fibers are of polyethylene terephthalate and 50% are cotton. The metallization process using copper deposited by a currentless wet-chemical method, is known from German Offenlegungsschrift No. 1,197 720. The cloth is immersed in a hydrochloric acid bath (pH$\leq$1) of a colloidal palladium solution at room temperature. After remaining under gentle motion for approximately 2 minutes, the material is removed and is rinsed with water at room temperature. It is then introduced in to a 50% soda lye solution at room temperature for approximately 1.5 minutes. The sample is then rinsed with water for approximately 30 seconds at room temperature and is then introduced into a solution consisting of 30 g/l of copper sulphate, 100 g/l of Seignette salt and 50 ml/l of 37% by weight formaldehyde solution, at room temperature. A pH value of 11 to 12 is established using soda lye. After 20 seconds, the surface of the activated material starts to change color, with metallic copper being deposited and hydrogen gas being evolved. After approximately 20 minutes a metallically shiny copper layer of approximately 0.8 $\mu$m is deposited on the fiber surface. After approximately 2 hours, approximately 200 g of copper metal had been deposited per $m^2$ on the cloth. The sample is rinsed and dried carefully in order to avoid surface oxidation of the copper layer. The surface resistance is 0.0102 ohm with a load current of 3 milliamperes per cm, and is 0.0110 ohm with a load current of 294 milliamperes per cm (measured according to DIN 54 345).

A copper layer from 10 to 25 $\mu$m thick has proved to be optimum for the cell, and it is not crucial whether the complete layer is applied chemically without current or electrochemically, provided a first thin layer of metal has been deposited on the cloth chemically without current. A p-conducting $Cu_2S$-layer approximately 1 $\mu$m thick is then produced on the copper layer. A CdS-layer is then applied by spraying and the photoactive barrier layer is thus formed. This technique is described, for example, in the article by Savelli and Bougnot, supra. The coated cloth 1 is covered with a conductive or photoconductive resin 2, e.g. polyvinyl-N-carbazole, and is secured together with the counter electrode by a conductive or photoconductive resin. The counter electrode 3 is also a textile sheet structure metallized with copper. In order to obtain as barrier-free a transition as possible, it may be appropriate to apply thereon another layer made of gold, silver or nickel which is from 0.2 to 0.4 μm thick. The thickness of the resin layer 2 between the semiconductor layer and the counter electrode 3 should only be a few μm in order to ensure a low resistance connection; it should prevent short circuits between the metallized cloths.

Instead of organic conductive resins, non-conducting transparent (opaque) resins may also be used with a conducting or photoconducting additive, such as, for example, a ZnO, CdS or $TiO_2$-pigment in a conductive element and in grain sizes of from 0.1 to 0.5 μm, in concentration of from 1 to 15% by volume, optionally after sensitizing the pigment with dyes, for example, rhodamine B (further reference thereto is to be found in C. K. Chiang et al., Appl. Phys. Lett., (1978), Vol. 13, pp. 18–20).

Such cells may be operated as so-called front-wall cells or rear-wall cells. In the case of a front-wall cell, the light initially falls on the optically relatively dense electrode layer 1, the metallized cloth with the photosemiconductor barrier layer. The mesh width is chosen to be small enough so that from 50 to 95% of the incoming light is adsorbed. The light which penetrates is used in the region of the photo-current path for increasing the conductivity of the photoconducting resin 2. The cloth of the counter electrode 3 should be as thick as possible and should have a large specific surface area in order to ensure a low-resistance transition from the resin into the counter electrode (through the lining). By way of example, a suitable filament yarn cloth, the thickness of which is from 0.1 to 1.5 mm. is described in more detail hereinbelow. The filament yarn cloth consists of 100% polyacrylonitrile and has the following textile construction:

Warp and Woof:
238 dtex (effective) from dtex 220
96 Z 150,38.5 warp threads/cm and 27 woof threads/cm;

(dtex 220 of 96 means 96 monofilaments in the dtex 220-yarn. Z means direction; 150 means 150 rotations per meter in the yarn).

Weave: twill 2/2;
Weight: 155 g/m².

The cloth is nickel-plated. It is activated in a hydrochloric acid bath of a colloidol palladium solution and then in a solution consisting of 0.2 mol/l of nickel-II-chloride, 0.9 mol/l of ammonium hydroxide, 0.2 mol/l of sodium hypophosphite, in which sufficient ammonia was introduced for the pH value to be approximately 9.4 at 20° C. After 10 seconds, the sample already becomes darkly discolored by the nickel deposit. After 20 seconds, the sample floats upwards with hydrogen gas being evolved and is completely covered with nickel. The sample is left for 20 minutes in the metal salt bath and during this time absorbs it 40% by weight of nickel metal.

The cell illustrated in FIG. 1 may also be operated as a rear-wall cell. There again, the light initially penetrates the counter electrode 1 which should have a light-permeability of from 80 to 95% as a result of the mesh width of the cloth or the knitted cloth having been selected correspondingly large. The electrode 3 carrying the semiconductor barrier layer is thereby secured together with the counter electrode 1, as already described above, by a transparent conductive or photoconductive resin 2. The carrier for the photo-semiconductor barrier layer may advantageously have a pronounced three-dimensional structure in this type of cell, for example, it may be a velvet, velour or knitted fabric as sketched in FIG. 3, which ensures a good absorption of the incident light due to multiple reflection.

In another photovoltaic thin film cell, a nickel layer is applied similar to the copper layer which nickel layer is then transformed into a p-semiconductor by oxidation. Cadmium sulphide doped with selenium or tellurium is suitable as an n-semiconductor.

In another photovoltaic thin film cell, cadmium is deposited on a copper-nickel base, and is converted electro-chemically into CdS in a thickness of from 0.1 to 1 μm and is combined with an organic p-conductor.

It is also possible for a semiconductor to be composed of organic p- and n- semiconductors (e.g. doped polyacetylenes).

The conductive resins may be used simultaneously for covering the electrode and counter electrode. In this case as well, the large-area and low-resistance contact of the relatively poor-conducting resins through the metallic cloth is advantageous, the cloth being distinguished by a very low surface resistance and may be directly covered with the resin. The metallized cloths 1,3 serving as electrodes receive an approximately 25 μm thick copper covering, as a result of which the surface resistance decreases to values of less than 0.01 ohm, so that the voltage losses of large cells can be held below 100 millivolts. A surface layer which is made of metal and is approximately from 0.1 to 1 μm thick and affords as barrier-free a transition as possible (e.g. Au, Ag,Al Ni) may also be applied.

The solar cell may be provided with a transparent covering resin 4,5 for improving the resistance to atmospheric conditions and with protection agents against oxidative decomposition and light ageing. It is also possible to admix fluorescent dyes to the resin for increasing the efficiency of the photovoltaic cell, which dyes cause a wave length transformation in the absorption region of the photo-semiconductor barrier layer.

Figure 2:
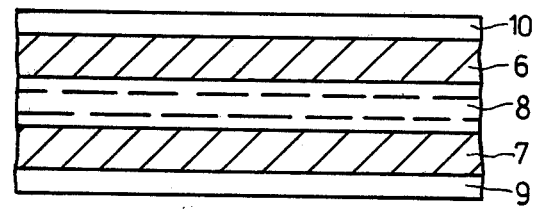
FIG. 2 is a schematic section through a "wet" solar cell.

A photoelectrochemical ("wet") photovoltaic cell is illustrated schematically in FIG. 2. Again in this case, metallized textile sheet structures provide the above-described advantages compared with the hitherto used flat electrodes, made of metal films, carbon plates or indium-doped tin-oxide on glass. A high current density in the electrolyte with low polarization is allowed due to the high specific area; the spatial depth staggering of the photoactive surfaces causes a more efficient light absorption by multiple reflections. A rear-wall cell is described in FIG. 2. The light initially penetrates through the counter electrode 6, e.g. a metallized cotton textile fiber cloth of large mesh width to provide a light permeability of from 80 to 95%. A gold layer which is from 0.2 to 0.5 μm thick is also applied without current or electro-chemically onto the copper layer which has been applied without current and is up to 25 μm thick. The electrode 7 carrying the photo-conductor is also coated with from 10 to 25 μm of copper and in addition thereto, is covered with a cadmium layer from 5 to 10 μm thick. The cadmium layer is then coated electro-chemically with an approximately from 0.1 to 1 μm thick photoconducting CdS-layer in an $Na_2S$-polysulphide electrolyte. The photoelectrode 7 and counter electrode 6 are positioned at a spacing of from 0.1 to 1 mm in a photoelectrochemical cell, using a light- and current permeable separator 8 (for example, a non-metallized filament yarn cloth). The liquid electrolyte consists of a mixture of 1 mol/l of $Na_2S$ and 0.05 mol/l of S in water. The semiconductor barrier layer is formed from contact of the cadmium sulphide surface with the electrolyte. The incoming light is absorbed by the thin (from 0.5 to 0.6 μm) semiconductor layer after one or more reflections. The semiconductor layer may be chosen to practically equal to the barrier layer thickness, without the reflection losses appreciably increasing. As a result thereof, charge carrier losses due to recombination may be avoided, which are otherwise very considerable with polycrystalline thin film layers. In this case as well, the solar cell may be provided with a transparent covering resin 9,10.

By modifying the metallized textile sheet structure, the characteristics of the solar cell may be even further improved. If, for example, a heavily nickel plated cloth according to German Offenlegungsschrift No. 2,743,768, in L 1/1 made of polyacrylonitrile textile fibers having a nickel content of 25 g/m$^2$, or a knitted cloth made of porous polyacrylonitrile textile fibers having a nickel content of 32 g/m$^2$ is steeped in a 7:3 tolueneisoproponol mixture with a solution of a polyureapolyurethane and is then dried under vacuum at an elevated temperature, then coatings which vary in thickness may be produced on the metallized textile sheet structures as a result of different concentrations of the solution. The electrical resistance of the metallized textile sheet structure may be considerably reduced by coating with this polyureapolyurethane, e.g., in the case of the first cloth from 10.9 ohm to 6.0 ohm and, in the case of the knitted cloth, from 11.6 to 6.6 ohm (the measured voltage in this case was 0.25 volts and the concentration of the coating was 5% PU). The effect is even more noticeable when the polyurethane concentration is increased to 20%; the resistance decreases by more than half. Further improvements in the electrical conductivity may be achieved by conductive additives in the coating resins.

The surface resistance of the metallized textile sheet structure may be further reduced by applying a very thin gold layer. A polyacrylonitrile-filament yarn cloth is copper-plated as described above, and after approximately 5 minutes, is coated with a 0.2 μm thick layer of copper. This lightly copper-plated sample is immediately introduced into an alkaline gold bath (70° C., 6 g of potassium gold cyanide per liter of water, pH 10). After 5 seconds, gold has already been deposited on the cloth. After 5 minutes, the thickness of the gold layer is approximately 0.2 μm. The surface resistance of this sample is 0.4 ohm (measured according to DIN 54345).

Figure 3:
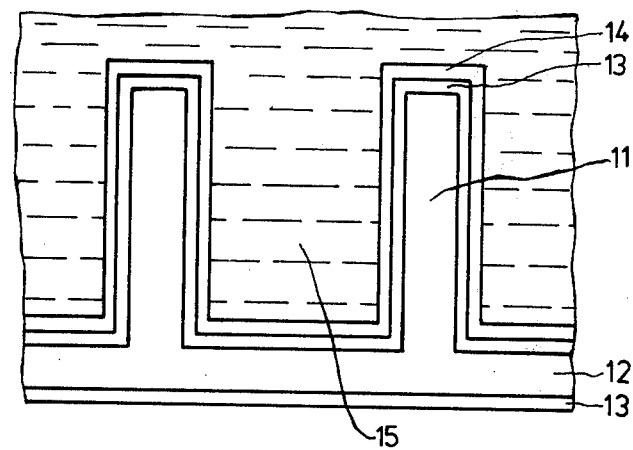
FIG. 3 is a schematic section through an electrode with a "velvet structure"

FIG. 3 illustrates a very enlarged view of a metallized textile sheet having a "velvet structure." The "velvet bristles" 11 stand-off approximately at right angles from the base 12. A continuous coating 13, 14 on each bristle 11 and on the base 12 is achieved by the currentless wet-chemical metal deposition. Reference number 13 denotes the good conductivity metal layer and 14 denotes the semiconductor layer which does not need to be thicker than the depletion layer barrier. The space around and above the bristles 11 is filled with electrolyte 15. Such an electrode structure is particularly suitable for a rear-wall cell. The light entering from above is transformed with a greater efficiency than in the case of a planar arrangement, due to the multiple reflections.

Figure 4:
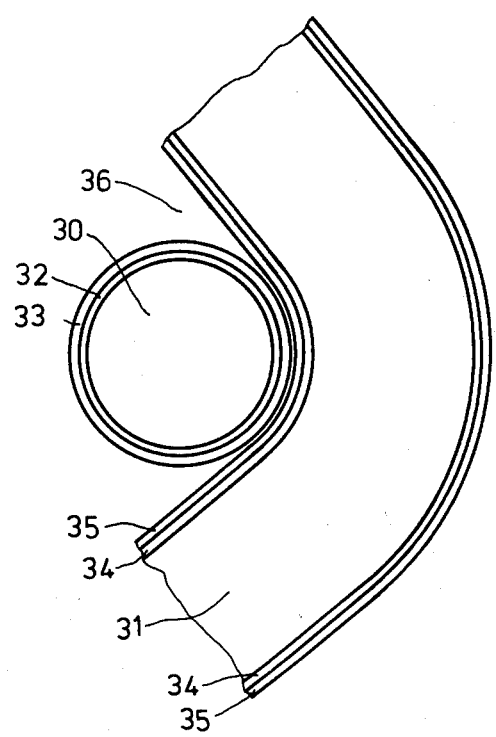
FIG. 4 shows schematically a section through a cell, where the electrode and counter electrode are combined in one textile sheet structure.

The electrode and counter electrode of a cell may also be housed within a single cloth. A section from such a cell is illustrated in FIG. 4. In the case of plain weaves 1/1 the warp threads 30 may serve as the electrode and the woof threads 31 as the counter electrode. During the production of the cloth, copper- and cadmium-plated threads are used, for example, for the warp and copper-and gold-plated threads for the woof. To produce the photo-semiconductor layer on the warp threads, a photoconducting cadmium sulphide layer is produced anodically on the cadmium-plated threads, as described above, after the cloth has been produced.

The layer 32 applied directly on to the warp threads 30 consists of cadmium/copper; the cadmium sulphide-layer 33 is located thereon. A first layer 34 made of nickel/copper, acts as a carrier for a gold layer 35 which represents the counter electrode, surrounds the woof thread 31.

The threads are surrounded by the electrolyte 36. In the "wet" photovoltaic cell, the barrier layer is formed between the electrolyte 36 and the cadmium sulphide layer 33. A cell of this type may be operated without a separator, because a short circuit to the woof threads is prevented by the dense cadmium sulphide layer. A filament yarn cloth is preferred for such cell construction. However a separator in the form of a coating (made of electrically non-conducting material) on the woof threads which is permeable to the ions of the electrolyte may also be used.

Such photovoltaic cells "within" one textile sheet structure have particularly low internal resistances due to the small electrode spacings and the high specific electrode area surface.

It will be understood that the specification and examples are illustrative but not limitative of the present invention and that other embodiments within the spirit and scope of the invention will suggest themselves to those skilled in the art.

We claim:

1. In a large-area photovoltaic cell containing a photoactive semiconductor layer which contacts another semiconductor layer, metal or an electrolyte to form a depletion layer, and further containing an electrode and a counter electrode for current collection, the improvement which comprises employing a metallized textile sheet as a substrate for said photoactive semiconducting layer, the metal constituting said electrode, the sheet having been metallized by depositing the metal thereon wet-chemically without current.

2. A cell according to claim 1, wherein the counter electrode also comprises a textile sheet which has been metallized wet-chemically without current.

3. A cell according to claim 1, wherein the thickness of the metal layer deposited on the textile sheet wet-chemically without current is from 0.05 to 2.5 μm.

4. A cell according to claim 1, wherein following the wet-chemical current-free metal deposit the metal thickness is built up electrochemically.

5. A cell according to claim 1, wherein the surface area of the metallized textile sheet is larger than its geometrical surface.

6. A cell according to claim 1, wherein the photoactive semiconductor is produced chemically from the metal layer carried by the textile sheet.

7. A cell according to claim 1, wherein the metallized textile sheet structure has a spatial depth-structure which completely absorbs any incident active radiation by multiple reflection.

8. A cell according to claim 1, including a conductive or photo-conductive separating film between the electrode and counter electrode.

9. A cell according to claim 8, wherein the separating film has present therein a sensitizer or fluorescent dye.

10. A cell according to claim 1, carrying a transparent protective layer.

11. A cell according to claim 1, wherein the electrode and counter electrode are combined in one textile sheet, one as the warp and the other as the woof.

* * * * *